United States Patent [19]

Cook

[11] Patent Number: 4,795,966
[45] Date of Patent: Jan. 3, 1989

[54] METHOD AND APPARATUS FOR MEASURING THE EQUIVALENT SERIES RESISTANCES OF A CAPACITOR

[75] Inventor: Terry D. Cook, Sioux Falls, S. Dak.
[73] Assignee: Sencore, Inc., Sioux Falls, S. Dak.
[21] Appl. No.: 858,715
[22] Filed: May 2, 1986
[51] Int. Cl.⁴ ............ G01R 27/08; G01R 31/12
[52] U.S. Cl. ................ 324/60 R; 324/60 CD; 324/548
[58] Field of Search ............ 324/60 CD, 60 C, 60 R, 324/51, 62, 54, 519, 522, 525, 548, 551

[56] References Cited
U.S. PATENT DOCUMENTS 3,453,535 7/1969 Anglin ............... 324/60 CD
3,986,108 10/1976 Thomas ............... 324/60 C
4,216,424 8/1980 Vette ............... 324/60 C X Primary Examiner—Reinhard J. Eisenzopf
Assistant Examiner—Jack B. Harvey
Attorney, Agent, or Firm—Edmond T. Patnaude

[57] ABSTRACT

An instrument for measuring the equivalent series resistance of a capacitor includes a plurality of constant current generators across which a capacitor under test is adapted to be connected. A selected one of the generators is periodically enabled to supply a constant current to the capacitor and the voltage across the capacitor is measured and displayed a short time after the generator is enabled, after which time the capacitor is discharged and the measuring cycle is repeated.

9 Claims, 2 Drawing Sheets

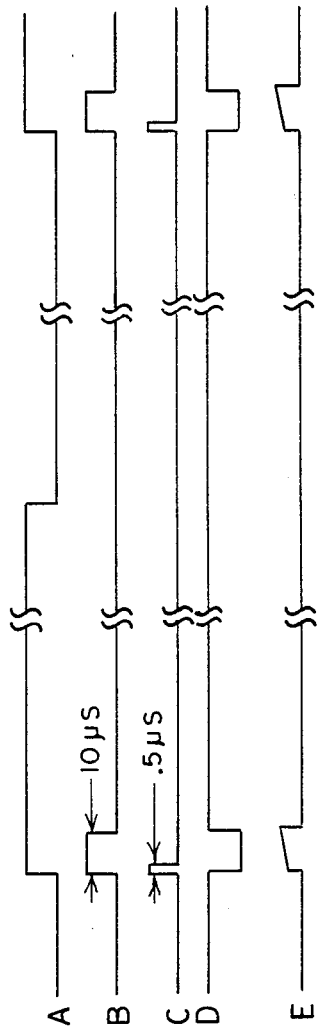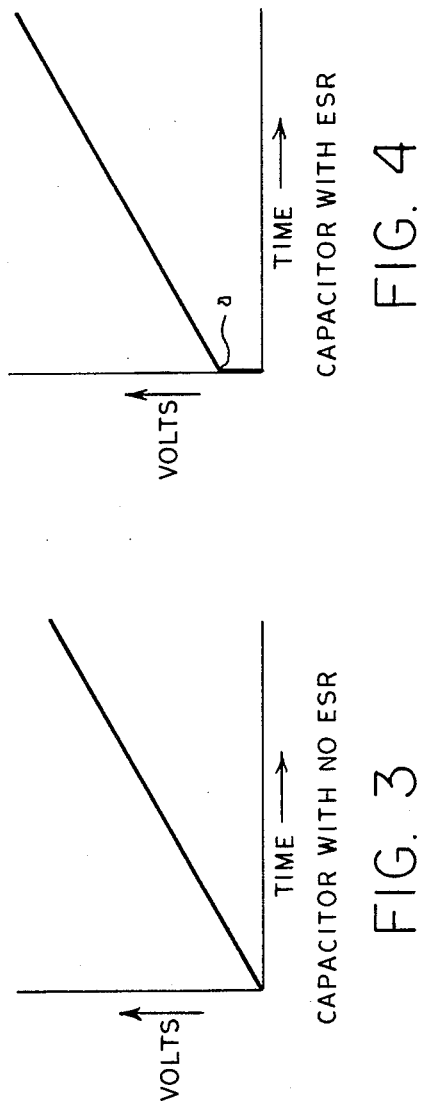

METHOD AND APPARATUS FOR MEASURING THE EQUIVALENT SERIES RESISTANCES OF A CAPACITOR

The present invention relates generally to the measurement of the equivalent series resistance of a capacitor, and it relates in particular to a new and improved method and instrument for measuring the equivalent series resistance of a capacitor in a facile and economical manner.

BACKGROUND OF THE INVENTION

The equivalent series resistance of a capacitor is the inherent characteristic of a capacitor to have a certain amount of resistance in series with its capacitance characteristics. An ideal capacitor would have no series or parallel resistance, and its impedance would be totally capacitive in nature. However, practical capacitors have both series resistance and parallel resistance, the parallel resistance resulting in leakage of the charge across the capacitor and the series resistance resulting in a reduction in the charging and discharging rates of the capacitor.

The series resistance of a capacitor will vary as the capacitor ages for various reasons including dehydration of the electrolyte. Also, the welds or joints that connect the leads to the capacitor frequently become broken, loose or corroded. It is apparent that if the series resistance of the capacitor becomes large enough the capacitor becomes in essence an open circuit.

Accordingly, when servicing electronic equipment it is desirable for the service technician to measure the equivalent series resistance of the capacitors in the circuit which is under consideration. In the past such tests have been relatively time consuming, and therefore, an object of the present invention is to provide a faster and more economical way to measure the equivalent series resistance of a capacitor.

SUMMARY OF THE INVENTION

Briefly, there is provided in accordance with the present invention a new and improved method for measuring the equivalant series resistance of a capacitor by charging the capacitor from a constant current source and measuring the voltage which is developed across the capacitor shortly after the capacitor begins to charge. That measured voltage and the value of the charging current are then used to calculate and subsequently display the equivalent series resistance of the capacitor.

In a preferred embodiment of the present invention an equivalent series resistance meter includes a plurality of constant current sources for respective uses with different amounts of equivalent series resistance, a first pulse generator whose output pulses are used to periodically discharge the capacitor and to enable the selected one of the constant current generators to charge the capacitor by means of a constant current, and a second pulse generator which enables a voltage level measuring device to sample the voltage across the capacitor at a time less than one microsecond after the constant current generator is enabled and the charging current is supplied to the capacitor. After the voltage level has been sampled, the capacitor is discharged for a time sufficient to insure that it is totally discharged. A discharge period of one millisecond or more has been found to adequately discharge the usual capacitor.

Inasmuch as the value of the charging current is a known factor, a simple voltage divider may be used to divide the measured voltage level by the charging current to calculate the equivalent series resistance of the capacitor and a visual representation of that resistance value is displayed on a digital readout of the instrument.

GENERAL DESCRIPTION OF THE DRAWINGS

The present invention will be better understood by a reading of the following detailed description taken in connection with the accompanying drawings wherein:

FIG. 2 is a timing diagram which is useful in understanding the operation of the circuit shown in FIG. 1;

FIG. 3 is an illustration of the charging curve of an ideal capacitor having no equivalent series resistance; and FIG. 4 is the charging curve of a practical capacitor having equivalent series resistance.

DETAILED DESCRIPTION OF A PREFERRED EMBODIMENT OF THE INVENTION

Figure 1:
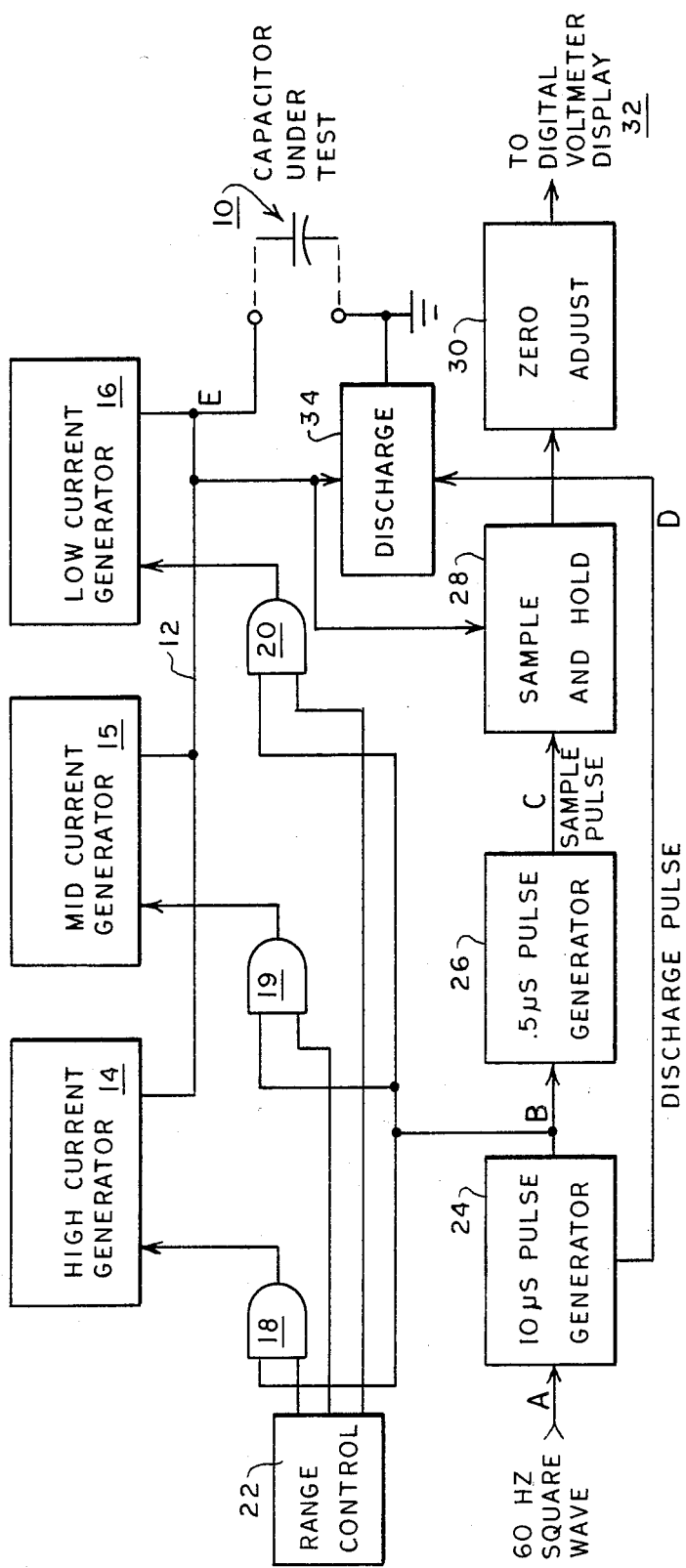
FIG. 1 is a schematic circuit diagram of an instrument for measuring the equivalent series resistance of a capacitor.

Referring first to FIG. 3, there is shown the charging curve of an ideal capacitor being charged from a constant current source. It may be seen that with the ideal capacitor i.e., a capacitor having no equivalent series resistance, the voltage increases directly in proportion to time when the capacitor is connected to a constant current source and as is well known, the slope of the charging curve is directly related to the applied current, and to the capacitance of the capacitor. This charging curve is linear inasmuch as the capacitor is assumed to be charged by means of a constant current source.

Referring to FIG. 4, there is shown the charging curve of an actual capacitor having equivalent series resistance and being charged from a constant current source. It may be seen that the voltage across the capacitor increases almost instantaneously to a value dependent upon the equivalent series resistance of the capacitor when the charging current is initially applied to the capacitor. The value of the voltage at point "a" is equal to the product of the charging current and the equivalent series resistance of the capacitor. Thereafter, the voltage across the capacitor changes in accordance with the following equation:

$$dV = (I/C)(dt) + IR$$

In accordance with the present invention the equivalent series resistance is measured by looking at the charge ramp or charge voltage of the capacitor only during the first instant when the capacitor begins to charge, i.e., the voltage is measured as close to point a as is possible. This is possible because the slope of the charging curve of a large value capacitor is not very steep and by specifying a minimum value of the capacitor under test, the small change in voltage which occurs between the initiation of the charging current and the time thereafter when it is practical to sample the voltage level, does not appreciably affect the measured value of the equivalent series resistance.

Referring to FIG. 1, there is shown in schematic form an instrument for measuring the equivalent series resistance of a capacitor 10 under test. One terminal of the capacitor 10 is connected to ground and the other terminal is connected to bus 12 which is in turn connected to the outputs of a plurality of constant current generators 14, 15 and 16. The generators 14, 15, and 16 which constitute constant current sources are respectively adapted to be enabled by the output of a plurality of AND gates 18, 19 and 20. A suitable range control switch 22 provides an output to one of the two inputs of a selected one of the AND gates 18, 19 and 20 when the range control 22 is adjusted in accordance with the expected range of the equivalent series resistor of the capacitor under test. For example, if the resistance is expected to be between zero and nine ohms the range control when properly set will provide a signal to the AND gate 18 which in turn will enable the high current generator 14 when the other input terminal of the AND gate 18 goes positive.

A 60 Hz square wave, which may be obtained by shaping the AC public power line signal appears at the input of a 10 μs pulse generator 24. This waveform is shown at A in FIG. 2. The pulse generator 24 developes at one of its two outputs an output waveform B. The waveform B is illustrated in FIG. 2, and as shown, it is coupled to one of the inputs of each of the AND gates 18, 19 20. Accordingly, dingly, the selected one of the generators 14, 15 and 16 which is selected by the range control 22 is enabled during the ten microsecond pulse from the generator 24 and applies a constant current to the capacitor 10 under test.

The waveform B of the signal from the generator 24 is applied to a 0.5 microsecond pulse generator 26 which developes a signal having a waveorm C at its output. The waveform C is shown in FIG. 2. This signal enables a sample and hold circuit 28 to sample the voltage across the capcitor 10. The voltage across the capacitor 10 has a waveform E as shown in FIG. 2. The output of the sample and hold circuit 28 is a DC voltage equal to the voltage at point "a" in FIG. 4. This output is coupled to a zero adjust circuit 30 which in turn drives a digital volt meter display 32. When the range control 22 is set, it also sets the range of the digital voltmeter display 32 which then displays a number which is proportional to the last voltage level sampled divided by the current of the particular one of the generators 14, 15 and 16 which is operative.

The ten microsecond pulse generator 24 also produces an output signal having a waveform D which is shown in FIG. 2 and which is applied to a discharge circuit 34 which initiates the discharge of the capacitor 10 at the trailing edge of the ten microsecond pulse. Inasmuch as the pulses from the generator 24 occur only once for every complete cycle of the 60 Hz square wave there is sufficient time between the discharging and measuring of the voltage across the capacitor under test to insure that the capacitor is completely discharged before the next resistance measurement is made.

The duration of the output pulse from the pulse generator 26 is not critical but it should be no longer than about one microsecond or the accuracy of the measurement will be impaired. Also, it could be less than 0.5 microseconds if circuit components operating at such high speeds are available. However, I have found that a measuring period of 0.5 microsecond provides accurate measurements with circuit components which are presently available at an economically justifiable price.

While the present invention has been described in connection with a particular embodiment thereof, it will be understood by those skilled in the art that many changes may be made without departing from the true spirit and scope of the present invention. Therefore, it is intended by the appended claims to cover all such changes and modifications which come within the true spirit and scope of this invention.

What is claimed:

1. Apparatus for measuring and displaying the equivalent series resistance of a capacitor comprising in combination current generator means for applying to said capacitor a constant charging current for a first predetermined period of time to cause the voltage across said capacitor to increase initially to a first level which is proportional to said equivalent series resistance of said capacitor and thereafter to increase at a rate proportional to said charging current, timer means for timing out a second period beginning with the initial application of said charging current to said capacitor and ending when said voltage across said capacitor is substantially at said first level, voltage measuring means responsive to said timer means for measuring said voltage across said capacitor at the end of said second period, and means responsive to the value of said voltage measured by said voltage measuring means for displaying a visual representation of the equivalent series resistance of said capacitor.

2. Apparatus according to claim 1, further comprising means responsive to said timer means for discharging said capacitor for a third predetermined time period beginning after the end of said first period.

3. Apparatus according to claim 2 wherein said timer means comprises a first pulse generating means for controlling the period during which said current generating means applies charging current to said capacitor and the period during which said capacitor is discharged.

4. Apparatus according to claim 3 wherein said timer means comprises a second pulse generating means for generating a pulse having its leading and trailing edges respectively coinciding with the beginning and end of said second period.

5. Apparatus according to claim 1 wherein said second period has a duration of no more than one microsecond.

6. Apparatus according to claim 5 wherein said current generator means comprises a plurality of constant current generators respectively producing different output currents, and means for selecting one of said plurality of current generators for charging said capacitor.

7. A method of measuring the equivalent series resistance of a capacitor, comprising in combination the steps of discharging said capacitor and then connecting it across a source of constant current to charge said capacitor and to develop across said capacitor a voltage which initially increases substantially instantaneously to a first voltage level and which thereafter increases linearly at a rate proportional to the capacitance of said capacitor and to the value of said current, measuring said first voltage level across said capacitor, and developing a signal proportional to said first voltage level divided by a signal proportional to said current to provide a signal which is proportional to the equivalent series resistance of said capacitor.

8. A method according to claim 7, wherein said step of measuring is carried out by measuring said first voltage at a time no later than one microsecond after connecting said capacitor to said source of current.

9. A method according to claim 8, wherein said step of measuring is carried out by measuring said first voltage at a time no later than 0.5 microsecond after connecting said capacitor to said source of current.

* * * * *